United States Patent [19]
Ghoshal

[11] Patent Number: 6,121,850
[45] Date of Patent: Sep. 19, 2000

[54] DIGITALLY ADJUSTABLE INDUCTIVE ELEMENT ADAPTABLE TO FREQUENCY TUNE AN LC OSCILLATOR

[75] Inventor: Uttam Shyamalindu Ghoshal, Austin, Tex.

[73] Assignee: International Business Machines Corporation, Armonk, N.Y.

[21] Appl. No.: 09/136,548

[22] Filed: Aug. 19, 1998

[51] Int. Cl.$^7$ .................................. H03B 5/12; H03J 5/00
[52] U.S. Cl. ..................................... 331/181; 331/117 FE; 331/179; 331/45; 334/11; 334/61
[58] Field of Search .............................. 331/36 L, 117 R, 331/117 FE, 117 D, 179, 181, 45; 333/235; 334/61, 11

[56] References Cited

U.S. PATENT DOCUMENTS

| | | | |
|---|---|---|---|
| 2,994,864 | 8/1961 | Van Allen | 331/181 |
| 3,155,922 | 11/1964 | Hackett | 331/181 |
| 3,263,184 | 7/1966 | French et al. | 331/36 L X |
| 3,760,301 | 9/1973 | Göransson et al. | 333/70 R |
| 5,912,596 | 6/1999 | Ghoshal | 331/117 R |
| 5,994,985 | 11/1999 | Pehlke et al. | 334/14 |

FOREIGN PATENT DOCUMENTS

| 268447 | 7/1963 | Australia | 331/36 L |
|---|---|---|---|

OTHER PUBLICATIONS

Electronics, "Inductor Control Gives AFC", *Electronics*, Feb. 1954, p. 972.

*Primary Examiner*—David Mis
*Attorney, Agent, or Firm*—Casimer K. Salys; Felsman, Bradley, Vaden, Gunter & Dillon, LLP

[57] ABSTRACT

A digitally adjustable inductive element which can be implemented in an integrated circuit. The digitally adjustable inductive element can include a first inductor, and a digital inductance controller operatively coupled to the first inductor which can be utilized to vary the effective inductance of the first inductor. The digitally adjustable inductive element can include a second inductor operatively coupled to the first inductor, and a digital current controller operatively coupled to the second inductor. The digital current controller can include a number of transistors operatively coupled to the second inductor. The digitally adjustable inductive element can be utilized to create a tunable oscillator. The tunable oscillator can include a first inductor, a digital inductance controller operatively coupled to the first inductor which can be utilized to vary the effective inductance of the first inductor, and an oscillator circuit which generates an oscillating signal utilizing the effective inductance of the first inductor. The tunable oscillator can include a second inductor operatively coupled to the first inductor, and a digital current controller operatively coupled to the second inductor. The digital current controller can include a number of transistors operatively coupled to the second inductor.

10 Claims, 3 Drawing Sheets

Digital current feedback. (a0, a1, . . , an) represent a n-bit thermometer code.

Digital current feedback. (a0, a1, ..., an) represent a n-bit thermometer code.

Typical quadrature oscillator design
(v1, v2, v3, v4 are quadrature phases)

DIGITALLY ADJUSTABLE INDUCTIVE ELEMENT ADAPTABLE TO FREQUENCY TUNE AN LC OSCILLATOR

BACKGROUND OF THE INVENTION

1. Technical Field

The present invention relates in general to a digitally adjustable inductive element. In particular, the present invention relates to a digitally adjustable inductive element which can be utilized to provide a tunable oscillator.

2. Description of the Related Art

In fabricating clock oscillator circuits utilized in digital circuits, it is often necessary to fabricate circuits which are tunable, such as circuits in which the center frequency may be altered. At high frequencies, oscillators based on LC circuits are preferred for reducing jitter and for scaling the power supply voltages. A tunable circuit contains some form of tuning so that the natural resonant frequency associated with the circuit may be varied. In such a circuit, the resonance condition of forced oscillations can be altered. Tuning may be carried out by adjusting the value of the capacitance or the inductance, or both.

An LC oscillator is a type of harmonic oscillator. Harmonic oscillators generate waveforms that are sinusoidal in nature and contain one or more active circuit elements that function to continuously supply power to passive components associated with the LC oscillator. A simple harmonic oscillator is typically composed of a frequency determining device, such as a resonant circuit, and an active element that supplies direct power to the resonant circuit and which also compensates for damping which occurs as a result of resistive losses. The resonant circuit contains both inductance and capacitance arranged in a manner such that the circuit is capable of generating resonant frequencies, depending on the value of the circuit elements and their particular arrangement.

In the case of a simple LC oscillator, application of a direct voltage causes free oscillations in the circuit which eventually decay because of the inevitable resistance in the circuit. Thus, an LC oscillator is essentially a tunable circuit that contains both inductance (L) and capacitance (C). The product, (LC), determines the center frequency of oscillation. The center frequency ($\omega_0$) is represented by the following equation:

$$\omega_o = \frac{1}{\sqrt{LC}}$$

These type of oscillator circuits are particularly important in synchronizing multiple processors such as those utilized in four-way or eight-way computer systems, well known in the art of digital and computer electronics. For a given computer system to operate properly, each processor must have a substantially identical center frequency. Due to process conditions, one processor clock may differ from another processor clock.

Even if such processor clocks are similar in structure and design, the oscillators upon which such clocks are based must be fine tuned in order to maintain an exact frequency match. Without a substantially exact frequency match, phase slippage results over time. In configurations in which voltage controlled oscillators and LC oscillators are utilized, it is necessary to maintain continuous frequency tuning of the voltage controlled oscillator and the LC oscillator, in order for the configuration to be practical in operation.

There are a number of methods which exist for tuning such circuits. For example, for one-time tuning, tuning can be accomplished utilizing wired fuses or focused ion beam tailoring, techniques well-known in the art. A particular tuning element also well known in the art is a reverse biased diode. When a diode is reverse biased, an associated capacitance is subsequently altered. This capacitance can be part of the C of an LC resonator. Such diodes have a very limited tuning range, usually a range of approximately 15%. When zero voltage occurs across the diode, the depletion capacitance is reduced approximately by an amount represented by the following equation:

$$\Delta C \cong \frac{C_{jo}}{\sqrt{2\varnothing_B + V_{DD}}}$$

In this equation, $\varnothing_B$ represents bulk potential. The limited tuning range implies targeting a center frequency perfectly, which is a difficult task to accomplish. In a very narrow band system that does not include multiple processors, a limited tuning range may be adequate, but for most systems, such a limited tuning range is inadequate.

Based on the foregoing, it can be appreciated that a need exists for a method and system which would allow a user to fine tune the frequency of an LC oscillator in a digital circuit clock. A need also exists to allow a wide range of tuning for such LC oscillators. Because a wide range of tuning is not currently feasible with current devices, applicability is limited to uniprocessor devices. A device, such as the one disclosed herein, not only solves processor problems associated with LC oscillators requiring a wide tuning range, but is also applicable to technological areas outside the processor arena. For example, such a device would also be advantageous in analog situations and technological areas such as wireless and communication networks. A device that allows fine tuning of clock oscillators would be welcomed by those in the industry currently limited in synchronizing circuits driven by current clock oscillator devices.

SUMMARY OF THE INVENTION

It is therefore one object of the present invention to provide a digitally adjustable inductive element.

It is therefore another object of the present invention to provide a digitally adjustable inductive element which can be utilized to provide a tunable oscillator.

The above and other objects are achieved as is now described. A digitally adjustable inductive element which can be implemented in an integrated circuit is disclosed. The digitally adjustable inductive element can include a first inductor, and a digital inductance controller operatively coupled to the first inductor which can be utilized to vary the effective inductance of the first inductor. The digitally adjustable inductive element can include a second inductor operatively coupled to the first inductor, and a digital current controller operatively coupled to the second inductor. The digital current controller can include a number of transistors operatively coupled to the second inductor. The digitally adjustable inductive element can be utilized to create a tunable oscillator. The tunable oscillator can include a first inductor, a digital inductance controller operatively coupled to the first inductor which can be utilized to vary the effective inductance of the first inductor, and an oscillator circuit which generates an oscillating signal utilizing the effective inductance of the first inductor. The tunable oscillator can include a second inductor operatively coupled to the first inductor, and a digital current controller operatively coupled to the second inductor. The digital current controller can include a number of transistors operatively coupled to the second inductor.

The above set forth objects, features, and advantages are in no way meant to be limiting, but are merely illustrative. Indeed virtually innumerable objects, features, and advantages of the present invention exist, some of which will become apparent in the following detailed description.

BRIEF DESCRIPTION OF THE DRAWINGS

The novel features believed characteristic of this invention are set forth in the appended claims. The invention itself, however, as well as a preferred mode of use, further objects, and advantages thereof, will best be understood by reference to the following detailed description of a preferred embodiment when read in conjunction with the accompanying drawings, wherein:

DETAILED DESCRIPTION OF PREFERRED EMBODIMENT

Figure 1:
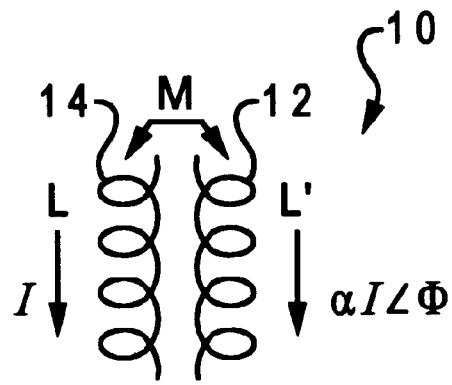
FIG. 1 illustrates a schematic diagram depicting two coils and their associated effective inductance.

With reference now to the figures and in particular with reference to FIG. 1, there is depicted a schematic diagram depicting two inductors and an associated total effective inductance. In a configuration 10 composed of inductor L 14 and inductor L' 12, the total effective inductance is given by equation 1 below. Inductor L 14 and inductor L' 12 are circuit elements based on phenomena associated with magnetic fields. A time-varying magnetic field induces a voltage in any conductor that is linked to the field. The circuit parameter of inductance thus relates the induced voltage to the current. The effective inductance $L_{eff}$ is thus provided by the following equation, where $L_{eff}$ varies in a range($L \pm \alpha M$) by changing the phase Ø:

$$L_{eff} = L + \alpha M e^{j\varnothing} \quad (1)$$

In equation 1 provided above, "α" represents an amplitude control factor and "Ø" is a phase control factor. The amplitude control factor "α" is defined to be the magnitude of the current in inductor L' 12 divided by the magnitude of the current in inductor L 14; furthermore, as will be shown below, in one embodiment "α" is the ratio of the magnitude of a feedback current to a resonant inductor loop current. "M" represents mutual inductance. "L" is simply the self inductance associated with an inductor. Lastly, "e" is the natural logarithmic base.

Figure 2:
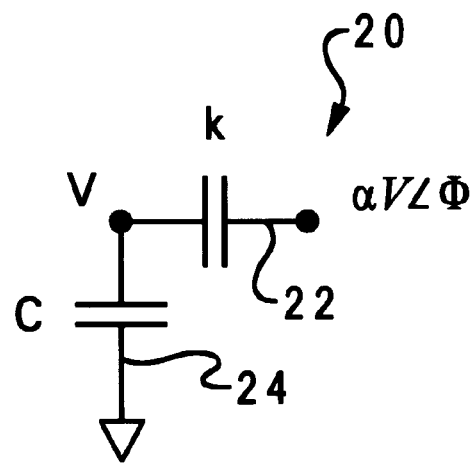
FIG. 2 depicts a schematic diagram illustrating two capacitors and their associated effective capacitance.

Those skilled in the art will appreciate that an analogous configuration is available for capacitors. For example, FIG. 2 depicts a schematic diagram illustrating two capacitors and their associated effective capacitance. In FIG. 2, a two capacitor configuration 20 is presented. The two capacitor configuration 20 is composed of capacitor 22 coupled to capacitor 24, which results in an effective capacitance, as illustrated by equation 2. Capacitors are circuit elements based on phenomena associated with electric fields. The source of the electric field is separation of charge, or voltage.

If the voltage varies with time, the electric field consequently varies with time. A time-varying electric field produces a displacement current in the space occupied by the field. The circuit parameter of capacitance relates the displacement current to the voltage, such that the displacement current is equivalent to the conduction current at the terminals of the capacitor. The effective capacitance $C_{eff}$ varies between (C±αk) by changing the phase Ø. The effective capacitance $C_{eff}$ is represented by equation 2 below:

$$C_{eff} = C - \alpha k e^{j\varnothing} \quad (2)$$

In an LC oscillator circuit, a center frequency can thus be calculated based on the effective inductances and capacitances available for that particular oscillator circuit. Those skilled in the art will appreciate that the center frequency $\omega_0$ is represented by the following equation 3 below:

$$\omega_o = \frac{1}{\sqrt{L_{eff} C_{eff}}} \quad (3)$$

Figure 3:
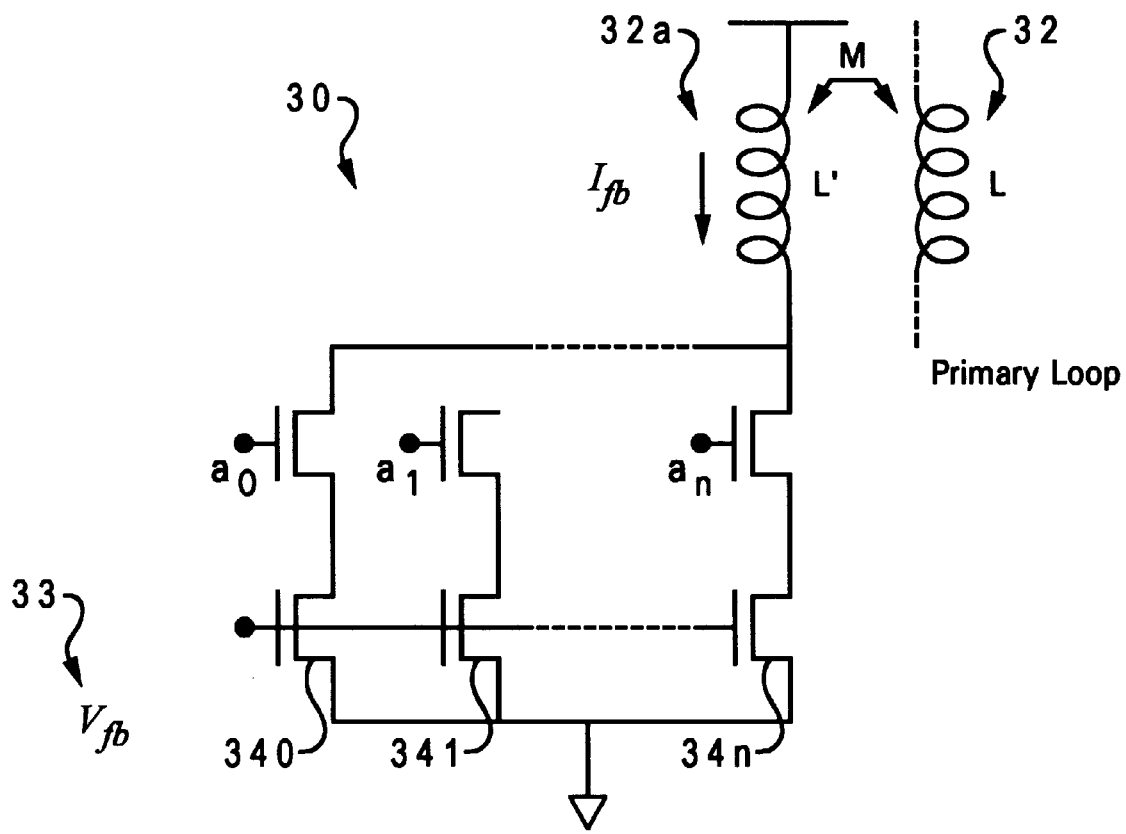
FIG. 3 illustrates a schematic diagram of an inductor circuit which utilizes inductor feedback, in accordance with an embodiment of the present invention.

FIG. 3 illustrates an inductor circuit 30 which utilizes inductor feedback, in accordance with a preferred embodiment of the present invention. In FIG. 3, two inductors are presented, a first inductor L 32 and a second inductor L' 32a. The circuit in FIG. 3 is essentially a dynamic current source which creates a current in inductor L' 32a, whose magnitude is determined digitally by the thermometer code ($a_0$, $a_1$, $a_2$, ... $a_n$). The phase of the current in inductor L' 32a is in-phase with the voltage $V_{fb}$ 33 controlling the transistors 340, 341, ..., 34N. The controlling voltage $V_{fb}$ 33 is chosen such that the phase of the current in inductor L' 32a is in-phase with the current in inductor L 32. The thermometer code ($a_0$, $a_1$, $a_2$, ... $a_n$) determines "α", the ratio of the magnitudes of the current in inductor L' 32a to the magnitude of the current in inductor L 32. The effective inductance of the inductors L 32 and L' 32a can range from L to L+αM when the currents in L' 32a and L 32 are in-phase, and from L to L−αM when the currents in L' 32a and L 32 are out-of-phase. As can be seen from the aforementioned equation 3, a change in inductance will change the center frequency of an LC oscillator. Consequently, the ability to change the inductance via use of the circuit shown in FIG. 3 can be utilized to tune an LC oscillator. In one embodiment of the invention, such ability is utilized to produce a quadrature oscillator circuit as will now be described.

Figure 4:
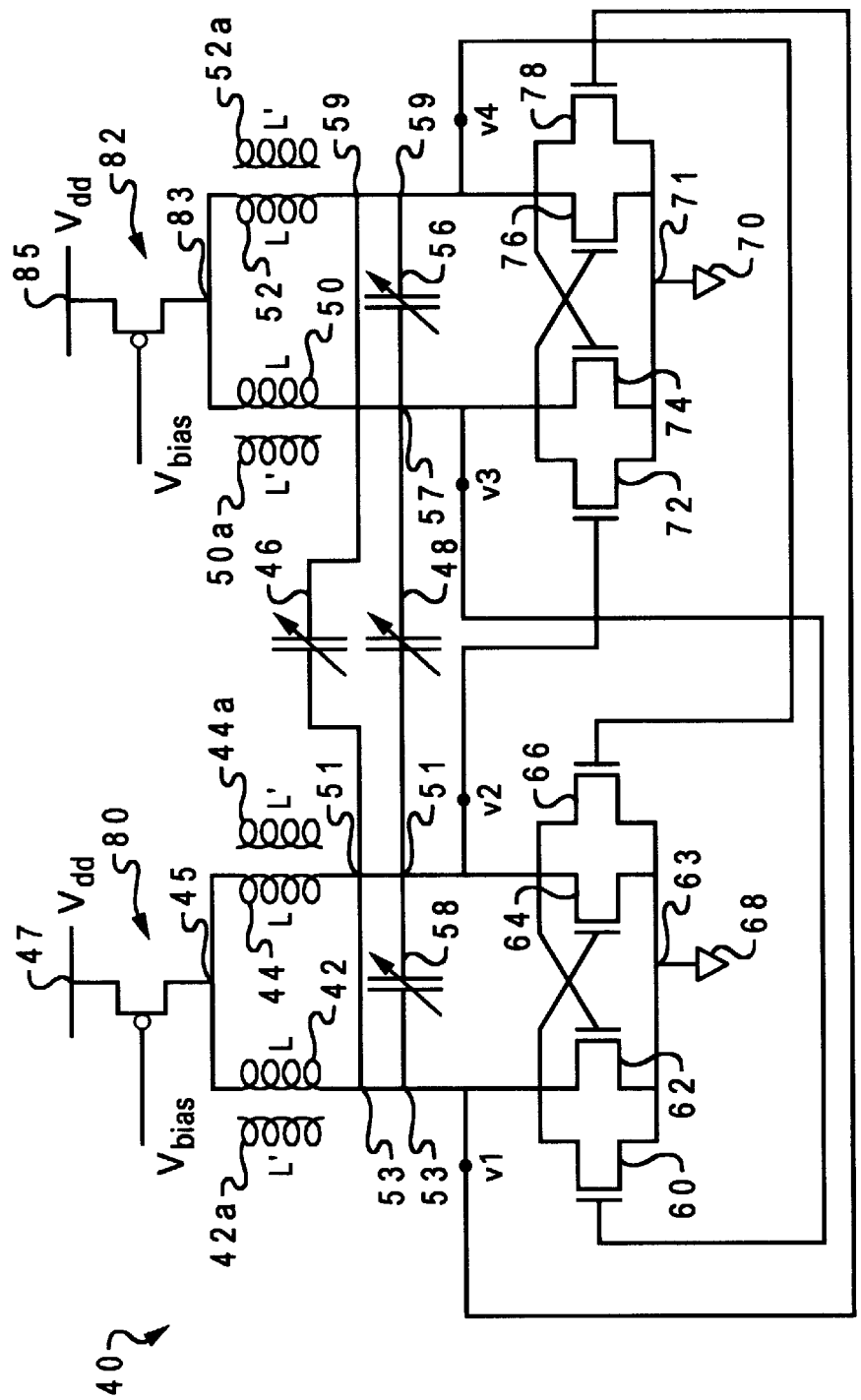
FIG. 4 depicts a schematic diagram illustrative of a quadrature oscillator circuit which forms a quadrature oscillator in accordance with a preferred embodiment of the present invention.

FIG. 4 depicts a schematic diagram illustrative of a quadrature oscillator circuit which forms a quadrature oscillator 40 in accordance with a preferred embodiment of the present invention. Quadrature oscillator 40 comprises inductors L 42, L 44, L 50, and L 52. Inductors 42 and 42a, inductors 44 and 44a, inductors 50 and 50a, and inductors 52 and 52a, operate according to the principals related to the text describing FIG. 1 to FIG. 3 herein. Thus, for example, inductors 44 and 44a are respectively analogous to inductors L 32 and L' 32a depicted in FIG. 3.

In an embodiment of the present invention, the foregoing allows the creation of variable "effective" inductances for inductors L 42, L 44, L 50, and L 52 by inductor pairs 42 and 42a, 44 and 44a, 50 and 50a, and 52 and 52a in a fashion similar to that described in relation FIG. 3. Consequently, the effective inductances of inductors L 42, L 44, L 50, and L 52, being variable, allow quadrature oscillator 40 to be "tuned." Inductors 42, 44, 50, and 52 are in turn connected to a bias network that includes transistors 80 and 82. The quadrature oscillator 40 follows the technique outlined in the text related to FIG. 3. Inductor 42 is connected to inductor 44 which are each connected to a transistor 80 at node 45. Transistor 80 is in turn connected to $V_{DD}$ at node 47. An adjustable capacitor 58 is positioned between node 53 and node 51 such that adjustable capacitor 58 is connected to inductor 42 at node 53 and to inductor 44 at node 51. A $V_{bias}$ voltage is applied to the gate of transistor 80 and to the gate of transistor 82. Capacitors 58, 48, 56, and 46 may be tunable capacitors.

Transistor 62 is connected to adjustable capacitor 58 and inductor 42 at node 53. Transistor 64 is connected to inductor 44 and adjustable capacitor 58 at node 51. The gate of transistor 62 is also connected to node 51. Transistor 60 is connected in parallel to transistor 62, while transistor 66 is connected in parallel to transistor 64. Transistors 60, 62, 64 and 66 are also connected to ground 68 at node 63.

Inductor 50 is connected to inductor 52. Each of these inductors are in turn each connected to transistor 82 at node 83. Transistor 82 is connected to voltage supply $V_{DD}$ at node 85. An adjustable capacitor 56 is positioned between node 57 and node 59 such that adjustable capacitor 56 is connected to inductor 52 at node 59 and to inductor 50 at node 57. Transistor 74 is connected to adjustable capacitor 56 and inductor 50 at node 57.

Transistor 76 is connected to inductor 52 and adjustable capacitor 56 at node 59. The gate of transistor 74 is also connected to node 59. Transistor 72 is connected in parallel to transistor 74, while transistor 78 is connected in parallel to transistor 76. Transistors 72, 74, 76 and 78 are also connected to ground 70 at node 71. Voltage phases (0, 90, 180, and 270 degrees) are respectively generated at node 53, 57, 51, and 59.

The quadrature oscillator 40 generates signals at a frequency $\omega_0$ corresponding to the LC resonance condition given by equation 3. At the LC resonance condition, the current through inductors L 42, L 44, L 50, and L 52 are in quadrature with the voltages at nodes 53, 51, 57, 59 respectively. The currents in the feedback inductors L' 42a, L' 44a, L' 50a, and L' 52a are generated by circuits analogous to the feedback circuit 30 in FIG. 3, such that the controlling voltages analogous to $V_{fb}$ 33 are the voltages at nodes 57, 59, 51, and 53, respectively. Hence the currents in inductors L' 42a, L' 44a, L' 50a, and L' 52a are in-phase with currents through the inductors L 42, L 44, L 50, and L 52, respectively. The magnitude of the currents in inductors L' 42a, L' 44a, L' 50a, and L' 52a is determined by the factor "$\alpha$" that is digitally varied by the thermometer code ($a_0, a_1, a_2, \ldots a_n$) in the feedback circuits. The adjustment of the factor "$\alpha$" is utilized to vary the effective inductances of inductors L 42, L 44, L 50, and L 52, and thereby tune the frequency of the quadrature oscillator 40. 10 Those skilled in the art will appreciate, based on the foregoing discussion, that a wide tuning range is indicated. Given a wide tuning range such as the one indicated herein, those skilled in the art can appreciate that a clock oscillator circuit based on the aforementioned LC oscillator circuit configuration provides an electronics user with the ability to fine tune digital circuits incorporating such LC oscillators.

The embodiments and examples set forth herein are presented in order to best explain the present invention and its practical application and, thereby, to enable those skilled in the art to make and use the invention. However, those skilled in the art will recognize that the foregoing description and examples have been presented for the purposes of illustration and example only. The description as set forth is not intended to be exhaustive or to limit the invention to the precise form disclosed. Many modifications and variations are possible in light of the above teaching without departing from the spirit and scope of the following claims.

What is claimed is:

1. A tunable oscillator, comprising:

a first inductor;

a second inductor operatively coupled to said first inductor;

a digital thermometer coder operatively coupled to said first inductor, and operating within a digital current controller to control inductance; and an oscillator circuit which generates an oscillating signal utilizing an effective inductance of said first inductor.

2. The oscillator of claim 1, wherein said digital current controller further includes a plurality of transistors operatively coupled to said second inductor and said thermometer coder.

3. The tunable oscillator of claim 1, further comprising an integrated circuit substrate in which said first inductor, said digital inductance controller, and said oscillator circuit are formed by integrated circuitry.

4. The tuneable oscillator of claim 1, wherein said oscillator circuit further comprises an LC oscillator circuit.

5. The tunable oscillator of claim 1, wherein said digital thermometer coder is connected in series with said first inductor between a current power source and ground.

6. The tunable oscillator of claim 5, wherein said digital thermometer coder further comprises a plurality of field effect transistors coupled in parallel between two common nodes.

7. The tunable oscillator of claim 1, wherein said oscillator is utilized to simultaneously adjust a plurality of inductors in an arm of a quadrature.

8. A digitally adjustable inductive element, comprising:

a first inductor;

a second inductor operatively coupled to said first inductor; and a digital thermometer coder operatively coupled to said first inductor, and operating within a digital current controller to control inductance.

9. The digitally adjustable inductive element of claim 8, wherein said digital current controller further includes a plurality of transistors operatively coupled to said second inductor and said thermometer coder.

10. The digitally adjustable inductive element of claim 8 further comprising said first inductor, and said digital inductance controller located within an integrated circuit formed on a substrate.

* * * * *